(12) United States Patent
Chen et al.

(10) Patent No.: US 9,169,549 B2
(45) Date of Patent: Oct. 27, 2015

(54) METHOD FOR MODIFYING LIGHT ABSORPTION LAYER

(75) Inventors: Wei-Chien Chen, Taichung (TW); Lung-Teng Cheng, Changhua County (TW); Ding-Wen Chiou, Taipei (TW); Tung-Po Hsieh, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 267 days.

(21) Appl. No.: 13/586,938

(22) Filed: Aug. 16, 2012

(65) Prior Publication Data

US 2013/0171759 A1 Jul. 4, 2013

(30) Foreign Application Priority Data

Dec. 28, 2011 (TW) .............................. 100149119 A

(51) Int. Cl.
| | |
|---|---|
| C23C 14/06 | (2006.01) |
| C23C 8/62 | (2006.01) |
| C23C 10/30 | (2006.01) |
| C23C 14/58 | (2006.01) |
| H01L 21/02 | (2006.01) |
| H01L 31/032 | (2006.01) |

(52) U.S. Cl.
CPC ............... *C23C 14/0623* (2013.01); *C23C 8/62* (2013.01); *C23C 10/30* (2013.01); *C23C 14/5866* (2013.01); *H01L 21/02422* (2013.01); *H01L 21/02491* (2013.01); *H01L 21/02568* (2013.01); *H01L 21/02664* (2013.01); *H01L 31/0322* (2013.01); *Y02E 10/541* (2013.01)

(58) Field of Classification Search
CPC ................................................. H01L 21/02422
USPC .......................................................... 438/69
See application file for complete search history.

(56) References Cited

U.S. PATENT DOCUMENTS

| | | | | |
|---|---|---|---|---|
| 5,981,868 | A | * | 11/1999 | Kushiya et al. ................ 136/262 |
| 6,092,669 | A | * | 7/2000 | Kushiya et al. ........... 204/298.13 |
| 6,268,014 | B1 | | 7/2001 | Eberspacher et al. |
| 7,824,465 | B2 | | 11/2010 | Larink |
| 7,998,789 | B1 | | 8/2011 | Chuang |
| 2007/0257255 | A1 | * | 11/2007 | Dhere et al. ...................... 257/40 |
| 2009/0130796 | A1 | * | 5/2009 | Taunier et al. .................... 438/94 |
| 2010/0068548 | A1 | * | 3/2010 | Carpenter et al. ............. 428/546 |
| 2010/0120192 | A1 | * | 5/2010 | Jung et al. ........................ 438/93 |
| 2010/0218827 | A1 | * | 9/2010 | Aono et al. .................... 136/264 |
| 2010/0243043 | A1 | * | 9/2010 | Chuang .......................... 136/256 |
| 2011/0023750 | A1 | * | 2/2011 | Wang .......................... 106/31.13 |
| 2011/0108096 | A1 | * | 5/2011 | Basol ............................ 136/252 |
| 2011/0207297 | A1 | | 8/2011 | Yaginuma et al. |
| 2011/0229989 | A1 | * | 9/2011 | Wieting ........................... 438/14 |
| 2012/0006687 | A1 | * | 1/2012 | Lee et al. ....................... 205/157 |
| 2012/0122321 | A1 | * | 5/2012 | Wieting ......................... 438/796 |
| 2012/0125425 | A1 | * | 5/2012 | Cho et al. ....................... 136/256 |
| 2012/0156827 | A1 | * | 6/2012 | Michael et al. ................. 438/95 |
| 2012/0164785 | A1 | * | 6/2012 | Blaydes et al. ................. 438/95 |
| 2012/0289033 | A1 | * | 11/2012 | Koetschau et al. ........... 438/478 |
| 2013/0025532 | A1 | * | 1/2013 | Leidholm et al. .............. 118/50 |
| 2013/0048074 | A1 | * | 2/2013 | Cho et al. ....................... 136/262 |
| 2013/0130432 | A1 | * | 5/2013 | Lee et al. ........................ 438/95 |

FOREIGN PATENT DOCUMENTS

| | | | | |
|---|---|---|---|---|
| CN | 101820029 | * | 2/2010 | ............. H01L 31/18 |
| FR | 2886460 | A1 | 12/2006 | |
| TW | 201036175 | A1 | 10/2010 | |
| TW | 201108425 | A1 | 3/2011 | |
| TW | 201127746 | A1 | 8/2011 | |

OTHER PUBLICATIONS

Basol et al. "Studies on Sulfur Diffusion into Cu (In, Ga) Se2 Thin Films", Progress in Photovoltaics: Research and Applications, 2000; 8: pp. 227-235.

Kim, et al. "Ga homogenization by simultaneous H2Se/H2S reaction of Cu—Ga—In precursor", Solar Energy Materials & Solar Cells 95, 2011, pp. 235-238.

Nagoya et al. "Role of incorporated sulfur into the surface of Cu(InGa)Se2 thin-film absorber", Solar Energy Materials & Solar Cells 67, 2001, pp. 247-253.

Nakada et al. "Improved Cu(In, Ga)(S,Se)2 thin film solar cells by surface sulfurization", Solar Energy Materials and Solar Cells 49, 1997, pp. 285-290.

Singh et al. "Surface sulfurization studies of Cu(InGa)Se2 thin film", Solar Energy Materials & Solar Cells 90, 2006, pp. 623-630.

Extended European Search Report, dated Mar. 18, 2013, for European Application No. 12189780.5.

* cited by examiner

*Primary Examiner* — Yu-Hsi D Sun
*Assistant Examiner* — Ankush Singal
(74) *Attorney, Agent, or Firm* — Birch, Stewart, Kolasch & Birch, LLP

(57) ABSTRACT

The disclosure discloses a method for modifying the light absorption layer, including: (a) providing a substrate; (b) forming a light absorption layer on the substrate, wherein the light absorption layer includes a Group IB element, Group IIIA element and Group VIA element; (c) forming a slurry on the light absorption layer, wherein the slurry includes a Group VIA element; and (d) conducting a thermal process for the light absorption layer with the slurry.

12 Claims, No Drawings

METHOD FOR MODIFYING LIGHT ABSORPTION LAYER

CROSS REFERENCE TO RELATED APPLICATIONS

This application claims priority of Taiwan Patent Application No. 100149119, filed on Dec. 28, 2011, the entirety of which is incorporated by reference herein.

TECHNICAL FIELD

The present disclosure relates to a method for modifying a light absorption layer, and in particular relates to a method for modifying a CIGS light absorption layer.

BACKGROUND

Description of the Related Art

Technological development in the solar cell industry is driven by global environmental concerns and raw material prices. Among the various solar cells developed, CIGS thin film ($Cu(In, Ga)Se_2$) solar cells have become the subject of considerable interest due to advantages of high conversion efficiency, high stability, low cost, and large area fabrication ability.

A CIGS compound is made by a Group IB-IIIA-VIA compound and has a chalcopyrite structure. The Group IB-IIIA-VIA compound is a direct band gap semiconductor material that is used as a light absorbing layer of a CIGS solar cell. By changing the element ratios of the CIGS compound, the band gap of the semiconductor material can be regulated.

In a conventional method for forming the CIGS compound, a CIGS light absorption layer is firstly formed and then a sulfurization step is conducted to increase the interface band gap.

However, the hydrogen sulfide ($H_2S$) gas used in the sulfurization step has high toxicity and high pollution, and the cost of the hydrogen sulfide ($H_2S$) gas is expensive making fabrication costs high. Furthermore, because the reaction between the hydrogen sulfide ($H_2S$) gas and the CIGS light absorption layer is a solid-gas reaction, if the gas is non-uniformly distributed in the reactin chamber, a poor uniformity of the light absorption layer will be obtained.

SUMMARY

The present disclosure provides a method for modifying the light absorption layer, including: (a) providing a substrate; (b) forming a light absorption layer on the substrate, wherein the light absorption layer comprises a Group IB element, Group IIIA element and Group VIA element; (c) forming a slurry on the light absorption layer, wherein the slurry comprises a Group VIA element; and (d) conducting a thermal process for the light absorption layer with the slurry.

DETAILED DESCRIPTION

In the following detailed description, for purposes of explanation, numerous specific details are set forth in order to provide a thorough understanding of the disclosed embodiments. This description is made for the purpose of illustrating the general principles of the disclosure and should not be taken in a limiting sense.

The disclosure provides a method for modifying the light absorption layer. A light absorption layer (CIGS layer) is firstly formed and then a slurry is coated on the light absorption layer. Then, a thermal process is conducted for the light absorption layer with the slurry to modify the light absorption layer. Thus, a CIGSS layer is formed from the CIGS layer.

The method for modifying the light absorption layer comprises step (a)-step (d). Firstly, in step (a), a substrate is provided, and the substrate comprises molybdenum (Mo), silver (Ag), aluminum (Al) or combinations thereof.

Then, in step (b), the light absorption layer is formed on the substrate. The light absorption layer comprises a Group IB element, Group IIIA element and Group VIA element. Thus, the light absorption is made by a Group IB-IIIA-VIA compound.

The Group IB element comprises copper (Cu), silver (Ag), gold (Au) or combinations thereof. The Group IIA element comprises aluminum (Al), indium (In), gallium (Ga) or combinations thereof.

The Group VIA element comprises a sulfur (S), selenium (Se), tellurium (Te) or combinations thereof.

In one embodiment, the Group compound is $CuInGaSe_2$. In another embodiment, the Group IB-IIIA-VIA compound is $CuInGaS_2$.

The light absorption layer is formed by a method comprising a vapor deposition method, sputter method, electrodeposition method or coating method. Note that the deposition methods are not limited to the above-mentioned methods, and other deposition methods are also included in the scope of the disclosure.

In one embodiment, an molybdenum (Mo) substrate is placed in a vapor deposition chamber, and the copper (Cu), indium (In), gallium (Ga) and selenium (Se) elements are deposited on the molybdenum (Mo) substrate by a heating system.

The Group IB element, Group IIIA element, and Group VIA element have a mole ratio of about (0.7-1.4):(0.7-1.4):(0.005-2.2), and preferably (0.7-1.3):(0.7-1.3):(0.006-2.2), and more preferably (0.8-1.3):(0.8-1.3):(0.008-2.2).

Then, in step (c), a slurry is formed on the substrate. The slurry comprises a Group VIA element and the Group VIA element comprises a sulfur (S), selenium (Se), tellurium (Te) or combinations thereof.

Note that the Group VIA element in the light absorption layer is different from the Group VIA element in the slurry. In one embodiment, when the light absorption layer comprises a sulfur (S) element, a slurry containing selenium (Se) is used. In another embodiment, when the light absorption layer comprises a selenium (Se) element, a slurry containing sulfur (S) is used.

Additionally, in yet another embodiment, when the light absorption layer is a CZTS compound containing sulfur (S), a slurry containing selenium (Se) is used. Alternatively, when the light absorption layer is a CZTS compound containing selenium (Se), a slurry containing sulfur (S) is used.

Furthermore, the slurry further comprises a solvent, and the solvent comprises water, alcohol-like solvent, ketone solvent, ether solvent, amine solvent, acid solvent or base solvent.

The alcohol-like solvent comprises methanol, ethanol, propanol, isopropanol, 1-butanol, isopentanol or ethylene glycol. The ketone solvent comprises acetone, butanone or methyl isobutyl ketone. The ether solvent comprises methyl ether, ethyl ester, methyl ethyl ether, diphenyl ether, ethylene glycol monomethyl ether, ethylene glycol monobutyl ether or ethylene glycol monoethyl ether acetate. The amine solvent comprises ethylamine, dimethyl acetamide, triethanol amine or diethanol amine. The acid solvent comprises nitric acid, hydrochloric acid, sulfuric acid, acetic acid or pyruvic acid.

The base solvent comprises sodium hydroxide (NaOH), potassium hydride (KOH), lithium hydride (LiOH), urea ($CON_2H_4$), ammonium water ($NH_3$), sodium bicarbonate ($Na_2CO_3$), hydrated sodium carbonate ($NaHCO_3$) or combinations thereof.

Note that the solvents are not limited to the type of solvents mentioned herein, as other single solvents or mixed solvents which can dissolve the above compounds may be implemented, and are within the scope of this disclosure.

In one embodiment, the slurry comprises water and sulfur powder. Additionally, additives may be added into the slurry according to actual applications. For example, a thickener may be added into the slurry to adjust the viscosity and adhesion of the slurry for subsequent coating processes.

The slurry is formed by a method comprising a capillary coating method, spin coating method, brush coating method, knife coating method, spraying method or printing method. Additionally, the slurry is formed at a temperature of 100° C.-200° C., and preferably 150° C.-170° C. The slurry has a thickness of about 10 nm-1000 nm, and preferably 300 nm-700 nm.

Next, in step (d), a thermal process is conducted for the light absorption layer with the slurry. The thermal process is conducted in an atmosphere which comprises air, nitrogen ($N_2$), hydrogen ($H_2$), argon (Ar), ammonia ($NH_3$), gas containing a Group IIIA element, or combinations thereof.

The atmosphere pressure of the thermal process was about 760 torr-$10^{-7}$ torr, and preferably 760 torr-$10^{-4}$ torr. The thermal process is conducted at a temperature of 300° C.-600° C., and preferably 450° C.-550° C. The thermal process is conducted for 10 second-8 hours, and preferably 1 minute-60 minutes.

Note that in prior art, the hydrogen sulfide ($H_2S$) gas is used in the sulfurization step. In the disclosure, the slurry containing a Group VIA element instead of the hydrogen sulfide ($H_2S$) gas is coated on the light absorption layer by a wet coating method. The light absorption layer is then modified by the thermal process.

Compared with prior art, the hydrogen sulfide ($H_2S$) gas is not used in the sulfurization step in the disclosure, and thus high toxicity and high fabrication costs are avoided. Additionally, the coating method may be applied to a large-area, and thus the uniformity of the light absorption layer is also improved.

An interface band gap and the open circuit voltage ($V_{oc}$) of the solar cell containing the light absorption layer of the disclosure may be improved by the above-mentioned modifying method. Indeed, the experimental data also shows that the open circuit voltage ($V_{oc}$) of the solar cell containing the light absorption layer of the disclosure was improved.

EXAMPLE

Example 1

The molybdenum (Mo) was coated on a soda-lime glass (SLG) substrate by a sputter method. Then, the Mo/SLG substrate was placed in a vapor deposition chamber, and the copper (Cu), indium (In), gallium (Ga) and selenium (Se) elements were deposited on the Mo/SLG substrate by a heating system to form a CIGS precursor film.

Then, the slurry containing sulfur (S) element was coated on the CIGS precursor film by a capillary coating method. The CIGS precursor film was placed on a heater plate and the slurry was dipped on it. Then, a glass cover plate was put above the CIGS precursor film. The heater was heated to about 115.2° C. (higher than the melting point of sulfur (S)), and thus the slurry containing sulfur (S) element was uniformly distributed on the CIGS precursor film by capillary force and the solvent in the slurry was removed by the heater.

Then, after the CIGS precursor film was placed and a temperature thereof was at room temperature, the glass cover was removed. Next, a thermal process was conducted to the CIGS film at 550° C. under $10^{-4}$ torr pressure for 10 minutes to obtain a CIGSS absorption layer.

Example 2

The CdS (as buffer layer), iZnO/AZO (as transparent conducting layer) and top electrode were sequential formed on the light absorption layer to form a solar cell. The solar cell was divided into six smaller solar cells (Cell 1-Cell 6). Table 1 shows that photoelectric efficiency test of the six solar cells.

Table 1 shows the open-circuit voltage ($V_{oc}$), short-circuit current ($J_{sc}$), fill factor, photoelectric conversion efficiency (%), series resistance ($R_s$) and shunt resistance ($R_{sh}$) of Example 1. The open-circuit voltage ($V_{oc}$) was about 0.56-0.59 V, the short-circuit current ($J_{sc}$) was about 20-24 mA/cm², the fill factor was about 67-69, and the photoelectric conversion efficiency (%) of the Example 1 was about 8-9.2%.

TABLE 1

| | $V_{oc}$ (V) | $J_{sc}$ (mA/cm²) | F.F. (%) | photoelectric conversion efficiency (%) | $R_{sh}$ (Ohm) | $R_s$ (Ohm) |
|---|---|---|---|---|---|---|
| Cell 1 | 0.58 | 20.492 | 69 | 8.242 | 3595 | 11 |
| Cell 2 | 0.58 | 22.274 | 69 | 8.910 | 2147 | 10 |
| Cell 3 | 0.59 | 20.382 | 69 | 8.396 | 4346 | 11 |
| Cell 4 | 0.56 | 21.839 | 67 | 8.309 | 1560 | 10 |
| Cell 5 | 0.57 | 23.774 | 68 | 9.189 | 1588 | 10 |
| Cell 6 | 0.58 | 21.542 | 69 | 8.596 | 2430 | 11 |

Comparative Example

The molybdenum (Mo) was coated on the soda-lime glass (SLG) substrate by a sputter method. Then, the Mo/SLG substrate was placed in a co-vapor deposition chamber, and the copper (Cu), indium (In), gallium (Ga) and selenium (Se) elements were deposited on the Mo/SLG substrate by a heating system to form a CIGS light absorption layer.

Then, the CdS (as buffer layer), iZnO/AZO (as transparent conducting layer) and top electrode were sequential formed on the CIGS light absorption layer to form a solar cell. The solar cell was divided into six smaller solar cells. Table 2 shows that photoelectric efficiency of the solar cells (Cell 1-Cell 6).

The difference between Example 2 and Comparative Example is that the light absorption layer of Comparative Example was not modified. As shown in Table 1 and Table 2, the open circuit voltage ($V_{oc}$) of Example 2 is indeed higher than that of Comparative Example. Thus, the interface band gap and the open circuit voltage ($V_{oc}$) were improved by modifying the light absorption layer.

TABLE 2

| | $V_{oc}$ (V) | $J_{sc}$ (mA/cm²) | F.F. (%) | photoelectric conversion efficiency (%) | $R_{sh}$ (Ohm) | $R_s$ (Ohm) |
|---|---|---|---|---|---|---|
| Cell 1 | 0.53 | 19.708 | 63 | 6.547 | 1026 | 12 |
| Cell 2 | 0.55 | 20.718 | 64 | 7.265 | 1096 | 12 |

TABLE 2-continued

| | $V_{oc}$ (V) | $J_{sc}$ (mA/cm$^2$) | F.F. (%) | photoelectric conversion efficiency (%) | $R_{sh}$ (Ohm) | $R_s$ (Ohm) |
|---|---|---|---|---|---|---|
| Cell 3 | 0.56 | 18.589 | 64 | 6.701 | 1062 | 13 |
| Cell 4 | 0.54 | 18.768 | 64 | 6.487 | 1397 | 13 |
| Cell 5 | 0.56 | 19.024 | 65 | 6.911 | 1263 | 14 |
| Cell 6 | 0.56 | 16.955 | 65 | 6.158 | 1254 | 14 |

Example 3

The fabrication method of Example 3 was the same as that of Example 2, except that the thermal process of Example 3 was conducted under 1 torr pressure. Table 3 shows the open-circuit voltage ($V_{oc}$), short-circuit current ($J_{sc}$), fill factor, photoelectric conversion efficiency (%), series resistance ($R_s$) and shunt resistance ($R_{sh}$) of Example 3.

| | $V_{oc}$ (V) | $J_{sc}$ (mA/cm$^2$) | F.F. (%) | photoelectric conversion efficiency (%) | $R_{sh}$ (Ohm) | $R_s$ (Ohm) |
|---|---|---|---|---|---|---|
| Cell 1 | 0.55 | 22.437 | 65 | 7.938 | 2837 | 12 |
| Cell 2 | 0.56 | 23.203 | 65 | 8.471 | 5284 | 12 |
| Cell 3 | 0.55 | 21.534 | 64 | 7.567 | 3355 | 13 |
| Cell 4 | 0.56 | 22.413 | 66 | 8.334 | 4137 | 11 |
| Cell 5 | 0.57 | 24.239 | 66 | 9.134 | 4305 | 11 |
| Cell 6 | 0.56 | 21.813 | 65 | 7.904 | 2978 | 12 |

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for modifying the light absorption layer, comprising:
    (a) providing a substrate;
    (b) forming a light absorption layer on the substrate, wherein the light absorption layer comprises a Group IB element Group IIIA element and Group VIA element;
    (c) forming a slurry on the light absorption layer, wherein the slurry consists of a Group VIA element and a solvent;
    (d) conducting a thermal process for the light absorption layer with the slurry; and
    (e) wherein the Group VIA element in the light absorption layer is different from the Group VIA element in the slurry.

2. The method for modifying the light absorption layer as claimed in claim 1, wherein the substrate comprises molybdenum (Mo), silver (Ag), aluminum (Al) or combinations thereof.

3. The method for modifying the light absorption layer as claimed in claim 1, wherein in the step (b), the light absorption layer is formed by a method comprising a vapor deposition method, sputter method, electrodeposition method or coating method.

4. The method for modifying the light absorption layer in claim 1, wherein the solvent comprises water, alcohol-like solvent, ketone solvent, ether solvent, amine solvent, acid solvent or base solvent.

5. The method for modifying the light absorption layer as claimed in claim 1, wherein in the step (c), the slurry is formed by a method comprising a capillary coating method, spin coating method, brush coating method, knife coating method, spraying method or printing method.

6. The method for modifying the light absorption layer as claimed in claim 1, wherein the slurry has a thickness of about 10 nm-1000 nm.

7. The method for modifying the light absorption layer as claimed in claim 1, wherein in the step (c), the slurry is formed at a temperature of 100° C.-200° C.

8. The method for modifying the light absorption layer as claimed in claim 1, wherein in the step (d), the thermal process is conducted in an atmosphere.

9. The method for modifying the light absorption layer as claimed in claim 8, wherein the atmosphere pressure of the thermal process was about 760 torr-10$^{-7}$ torr.

10. The method for modifying the light absorption layer as claimed in claim 8, wherein in the step (d), the atmosphere comprises air, nitrogen ($N_2$), hydrogen ($H_2$), argon (Ar), ammonia ($NH_3$), gas containing a Group IIIA element, or combinations thereof.

11. The method for modifying the light absorption layer as claimed in claim 1, wherein in the step (d), the thermal process is conducted at a temperature of 300° C.-600° C.

12. The method for modifying the light absorption layer as claimed in claim 1, wherein in the step (d), the thermal process is conducted for 1 minute-60 minutes.

* * * * *